United States Patent
Hurwitz et al.

(10) Patent No.: US 9,577,035 B2
(45) Date of Patent: Feb. 21, 2017

(54) ISOLATED THROUGH SILICON VIAS IN RF TECHNOLOGIES

(71) Applicant: Newport Fab, LLC dba Jazz Semiconductor, Newport Beach, CA (US)

(72) Inventors: Paul D. Hurwitz, Irvine, CA (US); Edward Preisler, San Clemente, CA (US); Hadi Jebory, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 152 days.

(21) Appl. No.: 13/950,143

(22) Filed: Jul. 24, 2013

(65) Prior Publication Data

US 2014/0054743 A1    Feb. 27, 2014

Related U.S. Application Data

(60) Provisional application No. 61/693,168, filed on Aug. 24, 2012.

(51) Int. Cl.
| | |
|---|---|
| *H01L 29/06* | (2006.01) |
| *H01L 21/762* | (2006.01) |
| *H01L 21/48* | (2006.01) |
| *H01L 21/768* | (2006.01) |
| *H01L 29/66* | (2006.01) |
| *H01L 29/737* | (2006.01) |
| *H01L 23/48* | (2006.01) |

(52) U.S. Cl.
CPC ......... *H01L 29/0642* (2013.01); *H01L 21/486* (2013.01); *H01L 21/76224* (2013.01); *H01L 21/76898* (2013.01); *H01L 23/481* (2013.01); *H01L 29/66242* (2013.01); *H01L 29/7378* (2013.01); *H01L 2924/0002* (2013.01)

(58) Field of Classification Search
CPC ............ H01L 21/76224; H01L 21/763; H01L 29/0642; H01L 23/5384; H01L 21/486; H01L 21/76898; H01L 29/0649
See application file for complete search history.

(56) References Cited

U.S. PATENT DOCUMENTS

| | | | | |
|---|---|---|---|---|
| 4,835,115 | A * | 5/1989 | Eklund | 438/426 |
| 5,744,719 | A * | 4/1998 | Werner | 73/514.32 |
| 6,143,412 | A * | 11/2000 | Schueller et al. | 428/408 |
| 6,724,066 | B2 * | 4/2004 | Swanson | H01L 21/84 257/526 |
| 7,564,115 | B2 * | 7/2009 | Chen et al. | 257/508 |
| 2006/0177874 | A1 * | 8/2006 | Yoo et al. | 435/7.1 |

(Continued)

*Primary Examiner* — Joseph C Nicely
(74) *Attorney, Agent, or Firm* — Farjami & Farjami LLP

(57) ABSTRACT

Disclosed are a structure for providing electrical isolation in a semiconductor substrate and an associated method for the structure's fabrication. The structure includes a deep trench isolation loop having a first depth disposed in the semiconductor substrate. A dielectric material is disposed in the deep trench isolation loop and one or more through silicon vias (TSVs), having a second depth, are disposed in the semiconductor substrate and within a perimeter of the deep trench isolation loop. A portion of the semiconductor substrate surrounding the deep trench isolation loop may be doped. A metallic filler may be disposed within the one or more TSVs and the metallic filler may be in direct electrical contact with the semiconductor substrate.

20 Claims, 10 Drawing Sheets

(56) References Cited

U.S. PATENT DOCUMENTS

| | | | |
|---|---|---|---|
| 2007/0230721 A1* | 10/2007 | White et al. | 381/166 |
| 2008/0173949 A1* | 7/2008 | Ma et al. | 257/371 |
| 2008/0265363 A1* | 10/2008 | Gambino | H01L 21/76229 257/510 |
| 2008/0305621 A1* | 12/2008 | Dyer et al. | 438/585 |
| 2009/0001502 A1* | 1/2009 | Tilke et al. | 257/506 |
| 2009/0289324 A1* | 11/2009 | Goodlin | H01L 21/308 257/506 |
| 2010/0193954 A1* | 8/2010 | Liu | H01L 21/76898 257/751 |
| 2010/0224965 A1* | 9/2010 | Kuo | 257/621 |
| 2010/0252905 A1* | 10/2010 | Hoilien | 257/505 |
| 2010/0302854 A1* | 12/2010 | Wu | G11C 11/34 365/185.18 |
| 2011/0062547 A1* | 3/2011 | Onishi | H01L 21/764 257/510 |
| 2011/0115047 A1* | 5/2011 | Hebert | H01L 21/743 257/508 |
| 2011/0175198 A1* | 7/2011 | Zhan | H01L 27/0259 257/592 |
| 2012/0044732 A1* | 2/2012 | Li et al. | 363/147 |
| 2012/0074515 A1* | 3/2012 | Chen et al. | 257/491 |
| 2012/0080802 A1* | 4/2012 | Cheng | H01L 23/481 257/774 |
| 2012/0104539 A1* | 5/2012 | Mehrotra | H01L 21/76232 257/506 |
| 2012/0153430 A1* | 6/2012 | Bachman | H01L 21/76224 257/508 |
| 2012/0235143 A1* | 9/2012 | Cai | H01L 29/737 257/51 |
| 2012/0256289 A1* | 10/2012 | Borsari | H01L 21/02112 257/506 |
| 2013/0001694 A1* | 1/2013 | Guan et al. | 257/355 |
| 2013/0001793 A1* | 1/2013 | Yu et al. | 257/774 |
| 2013/0140667 A1* | 6/2013 | Kalnitsky | H01L 21/823481 257/499 |
| 2013/0154021 A1* | 6/2013 | Chuang | H01L 21/823857 257/369 |
| 2013/0334669 A1* | 12/2013 | Kuo | H01L 23/481 257/621 |
| 2014/0015090 A1* | 1/2014 | Lin | H01L 29/66272 257/495 |

* cited by examiner

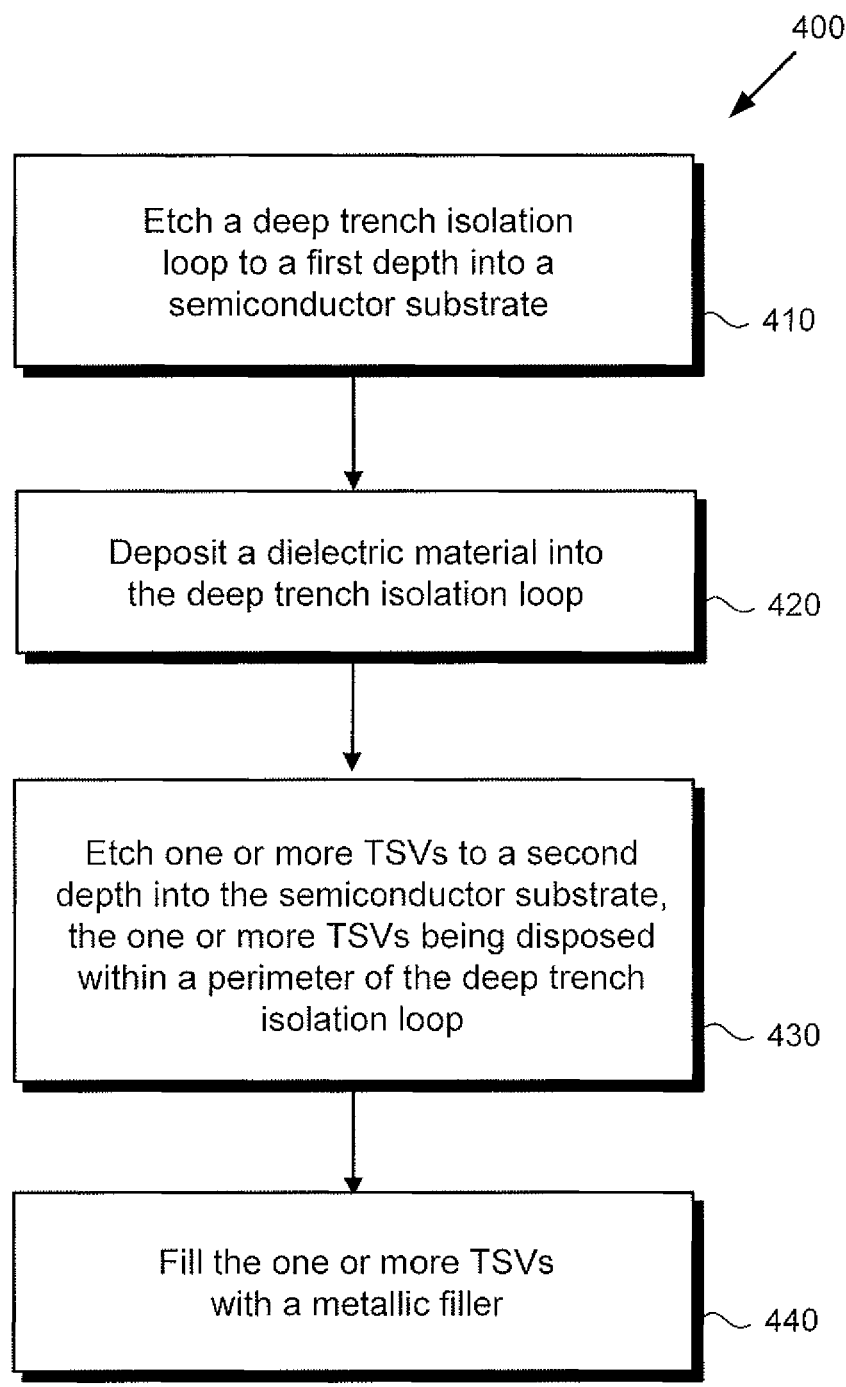

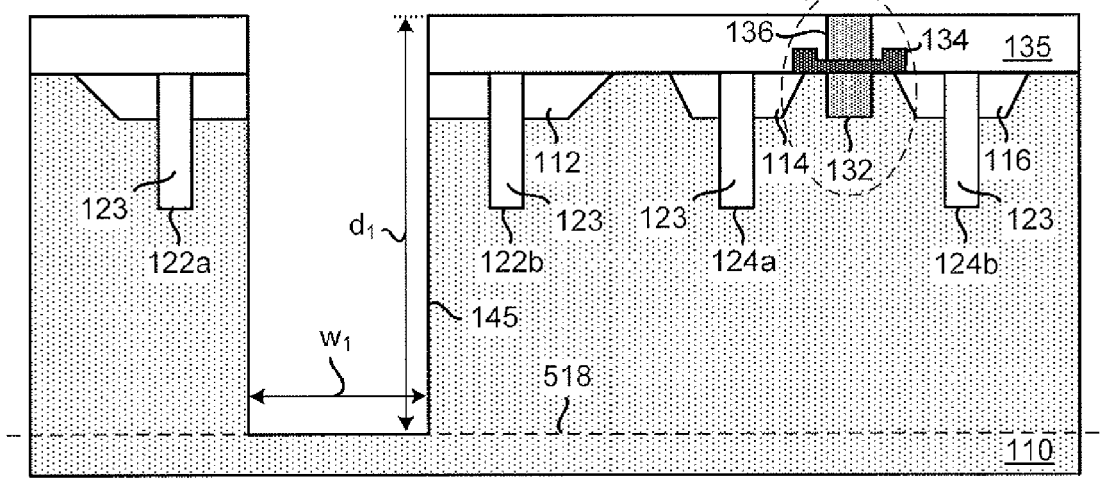
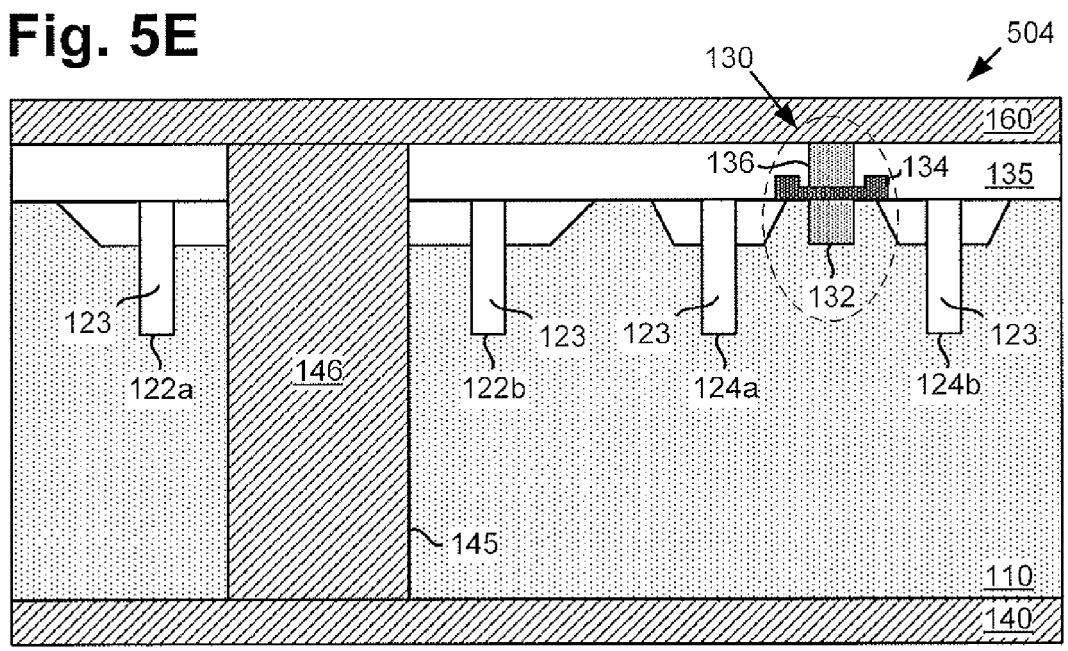

ISOLATED THROUGH SILICON VIAS IN RF TECHNOLOGIES

The present application claims the benefit of and priority to a provisional patent application entitled "Isolated Through Silicon Vias in Radio Frequency Technologies", Ser. No. 61/693,168 filed on Aug. 24, 2012. The disclosure in this provisional application is hereby incorporated fully by reference into the present application.

BACKGROUND

Integrated radio frequency (RF) technologies require low resistance, low inductance, and low capacitance paths from active components to ground for proper operation. However, as the frequency of operation increases, the inductance of certain interconnection structures, such as bond wires, significantly limits performance. Conventional solutions include through wafer vias (TWVs) extending to a backside ground connection of the wafer. To reduce intrinsic device capacitances, high resistivity silicon substrates having resistances of greater than 10 Ω/cm, for example, may be used. However, the use of grounded TWVs and high resistivity substrates within the same integrated technology may result in inadequate isolation between the devices within the substrate and the TWVs. For example, a heavily doped planar junction biased at 20V with respect to a 500 Ω/cm P-type substrate will result in a depletion region around the junction having a width of approximately 30 μm. Further increasing the bias voltage or the resistivity of the substrate will increase the width of this depletion region. If the TWV is located within this depletion region, the TWV will provide a source of carriers and recombination centers, resulting in excessive leakage current between the devices and the TWV.

To isolate the depletion region around the TWV, conventional solutions have utilized PN junction isolation. However, junction isolation requires the addition of a costly lithography step and long diffusion thermal cycles, which may not be compatible with the rest of the process sequence. In addition, diffusion of dopants from the junction may compromise the effectiveness of the high resistivity substrate unless very wide exclusion zones are maintained around the TWV.

SUMMARY

The present disclosure is directed to isolated through silicon vias in RF technologies, substantially as shown in and/or described in connection with at least one of the figures, and as set forth more completely in the claims.

BRIEF DESCRIPTION OF THE DRAWINGS

FIG. 4 presents a flowchart of actions taken to implement a method of fabricating an insulated TSV, according to an implementation of the present disclosure.

FIG. 5D illustrates a progressive cross-sectional view of the fabrication of an insulated TSV, according to an implementation of the present disclosure.

FIG. 5E illustrates a progressive cross-sectional view of the fabrication of an insulated TSV, according to an implementation of the present disclosure.

DETAILED DESCRIPTION

Figure 1A:
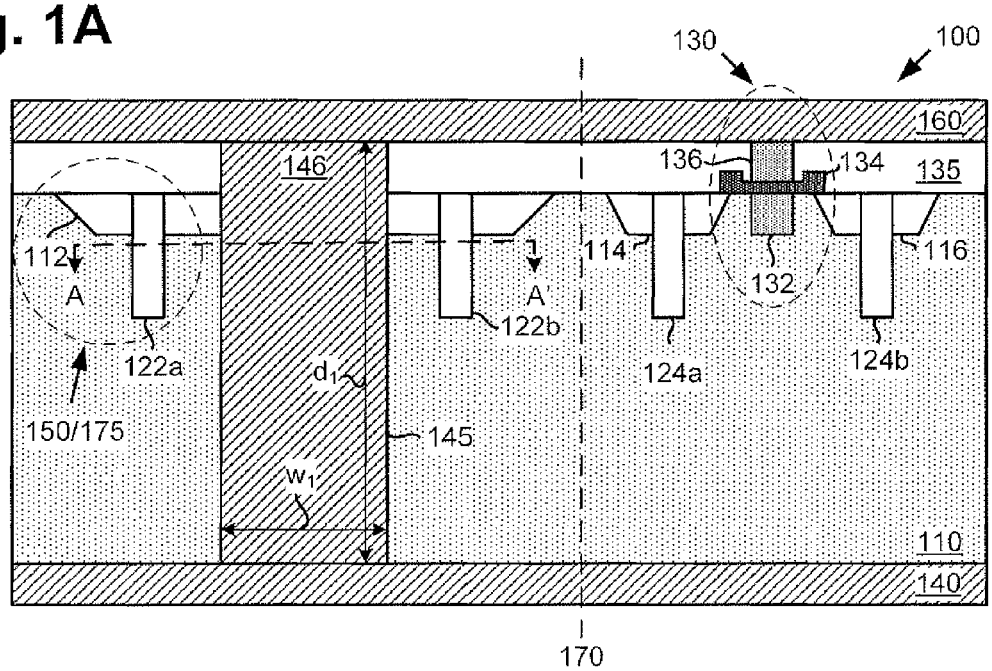
FIG. 1A illustrates an exemplary cross-sectional diagram of an isolated through silicon via, according to one implementation of the present disclosure.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The present inventive concepts utilize a deep trench (DT) isolation disposed in the substrate to completely surround and isolate a through silicon via (TSV). The region around the DT may be doped after trench etch using standard ion implantation techniques. The DT may include a thermal oxide liner to provide a low interface state density at the surface of the DT. In addition, the combined TSV and DT region may be enclosed in a P-well, which may be used as a body region for NFET devices in an optional subsequent BiCMOS process, for example. The P-well may provide a relatively low resistance path between the grounded TSV and the DT to ensure the doped silicon surrounding the trench is effectively grounded, regardless of substrate resistivity. Thus, the present application provides a reduced sidewall capacitance for bipolar devices, reduced current leakage to the TSV from active devices, and an increase in TSV isolation without the addition of costly lithography steps or long diffusion thermal cycles during fabrication.

FIG. 1A illustrates an exemplary cross-sectional diagram of an isolated through silicon via, in accordance with one implementation of the present disclosure. Cross-sectional view 100 shows semiconductor substrate 110, which may be formed from materials such as silicon (Si) or silicon germanium (SiGe) and may have a relatively high resistivity of ≥10 Ω/cm, for example. Semiconductor substrate 110 may include several shallow trench insulation regions (STIs) 112, 114 and 116. Several DTs 122a, 122b, 124a and 124b may be etched through STIs 112, 114 and 116 into semiconductor substrate 110. Cross-sectional view 100 may further include heterojunction bipolar transistor (HBT) 130 including collector 132, base 134 and emitter 136. However, HBT 130 need not be an HBT and may be any suitable transistor.

Premetal dielectric layer (PMD) 135 may be disposed on a top surface of semiconductor substrate 110. TSV 145 may be etched through PMD 135 and STI 112, and into semiconductor 110. TSV 145 may be filled with metallic filler 146, which may be titanium, tungsten or any other appropriate metallic filler. TSV 145 may have a width $w_1$ of approximately 15 μm and a depth $d_1$ of approximately 100 μm, extending to a bottom surface of semiconductor 110 after a subsequent backside polish. TSV 145 may be connected to a backside ground plate 140, which may be disposed on a backside of semiconductor substrate 110. TSV 145 may also contact metal 1 layer 160 disposed on a top surface of PMD 135. Thus, emitter 136 may be electrically connected to metallic filler 146 of TSV 145 by metal 1 layer 160. In addition, metallic filler 146 may directly contact the sidewalls of semiconductor substrate 110 within TSV 145 to properly ground the substrate.

DTs 124a and 124b may be a part of the same DT loop, which may completely surround HBT 130, providing electrical isolation for HBT 130. Likewise, DTs 122a and 122b may be a part of the same DT loop, which may completely surround TSV 145, providing electrical isolation for TSV 145. Due to surface effects within semiconductor substrate 110, most of the current leakage and carrier recombination occurs near the top surface of semiconductor substrate 110. Thus, isolation of at least the top portion of TSV 145 may be sufficient to substantially reduce leakage current to, and isolation of TSV 145. For this reason, DTs 122a and 122b need not extend the entire depth of TSV 145.

Thus, a signal generated by a voltage potential at collector 132 of HBT 130, for example, may be isolated from TSV 145 by DT loop 122. Consequently, the isolating effect of DT loop 122 allows high voltage devices to be placed closer to TSV 145 without leakage currents becoming prohibitively large. For example, where a conventional design may require separation of 10 μm for a high voltage device, such as HBT 130, the use of DT loop 122 may allow a separation of 5 μm or less.

Figure 1B:
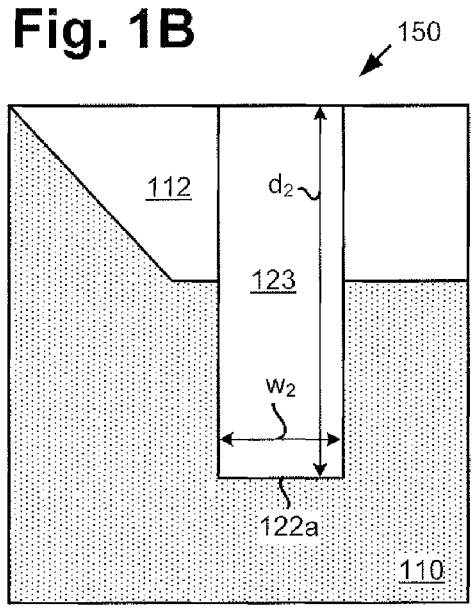
FIG. 1B illustrates an exemplary cross-sectional diagram of a deep trench isolation region, according to one implementation of the present disclosure.

FIG. 1B illustrates an exemplary cross-sectional diagram of a deep trench isolation region, in accordance with one implementation of the present disclosure. Specifically, FIG. 1B shows zoomed cross-sectional view 150 of DT 122a. DT 122a may be etched to a depth $d_2$ of approximately 15 μm through STI 112 and into semiconductor substrate 110. Width $w_2$ of DT 122a may be approximately 1.5 μm. However, the depth and width of DT 122a may be different from that stated above, in accordance with a particular design application. DT 122a may then be filled with dielectric material 123, which may include SiO2 or any other suitable dielectric material. Each of DTs 122b, 124a and 124b may have the same dimensions and fill as DT 122a.

Figure 1C:
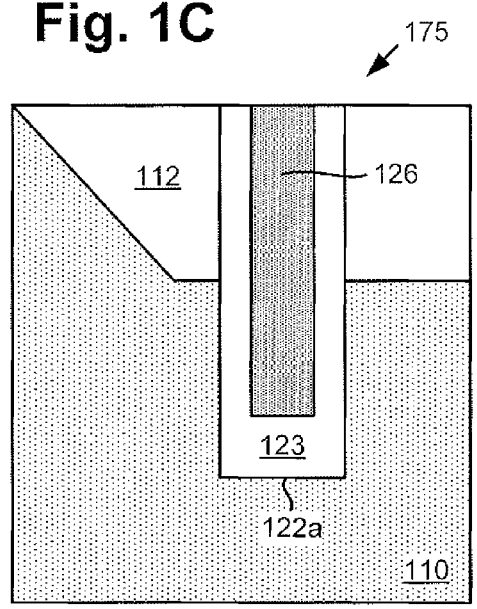
FIG. 1C illustrates an exemplary cross-sectional diagram of a deep trench isolation region, according to another implementation of the present disclosure.

However, each of the DTs need not be completely filled with a dielectric material. For example, FIG. 1C shows zoomed cross-sectional view 175 of DT 122a. FIG. 1C may be substantially the same as FIG. 1B, except instead of a complete dielectric fill, DT 122a may be only lined with dielectric material 123. Then filler material 126, which may be poly-silicon, may be deposited to fill the remainder of DT 122a. As stated regarding FIG. 1B, each of DTs 122b, 124a and 124b may have the same dimensions and fill as DT 122a.

Figure 2A:
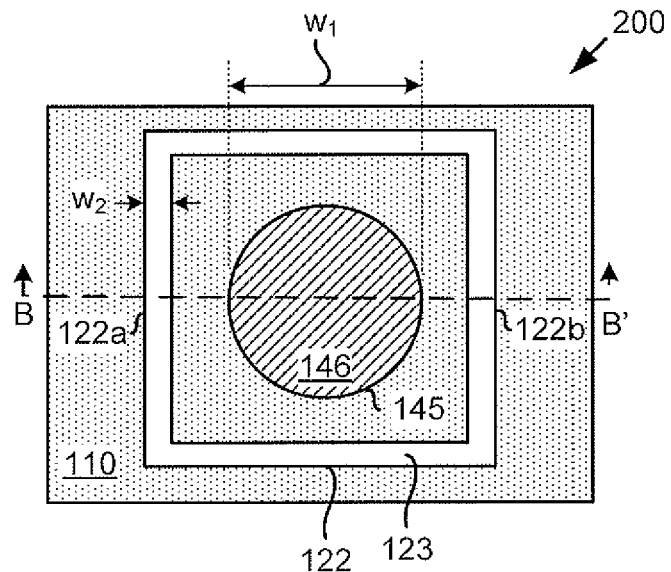
FIG. 2A illustrates an exemplary top view of an isolated through silicon via, according to one implementation of the present disclosure.

To better understand the concepts shown in FIGS. 1A and 1B, FIG. 2A illustrates an exemplary top view of an isolated through silicon via, in accordance with one implementation of the present disclosure. For example, top view 200 of FIG. 2A may correspond to a view of FIG. 1A left of line 170, and looking in the direction of the arrows at dotted line A-A'. Likewise, the portion of FIG. 1A to the left of line 170 may correspond to a view of FIG. 2A looking in the direction of the arrows at dotted line B-B'. Top view 200 shows TSV 145 completely surrounded by DT loop 122, including DTs 122a and 122b. DT loop 122, including DTs 122a and 122b, may have a width $w_2$ of approximately 1.5 μm, a depth $d_2$ of approximately 15 μm and may be filled with dielectric filler 123.

Figure 2B:
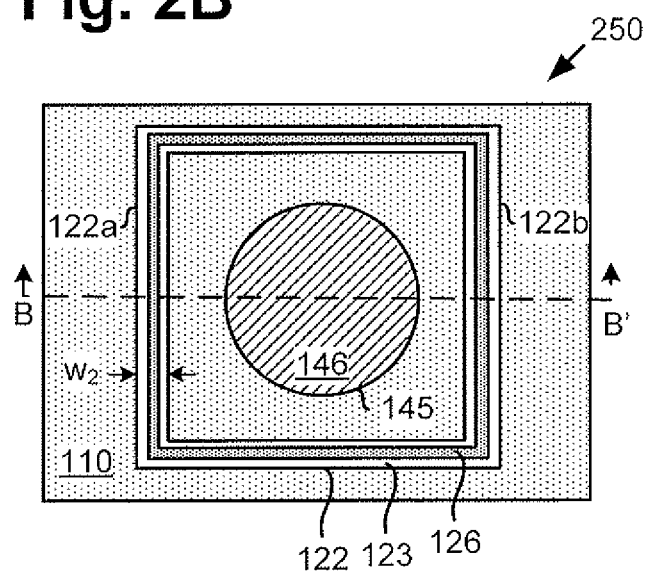
FIG. 2B illustrates an exemplary top view of an isolated through silicon via, according to another implementation of the present disclosure.

To better understand the concepts shown in FIGS. 1A and 1C, FIG. 2B illustrates an exemplary top view of an isolated through silicon via, in accordance with one implementation of the present disclosure. Top view 250 of FIG. 2B may be substantially the same as top view 200 of FIG. 2A, except that DT loop 122, including DTs 122a and 122b, may be only lined with dielectric material 123. Then filler material 126, such as poly-silicon, may be deposited to fill the remainder of DT loop 122.

The isolated TSV of the present application need not be limited to a single, large TSV. Instead, an array of smaller TSVs may be fabricated and electrically connected to one other. Such an arrangement may be desirable where the thermal expansion coefficient of semiconductor substrate 110 and metallic filler 146 are sufficiently different to cause cracking of the substrate due to thermal cycling during fabrication or high thermal loading during subsequent operation.

Figure 3A:
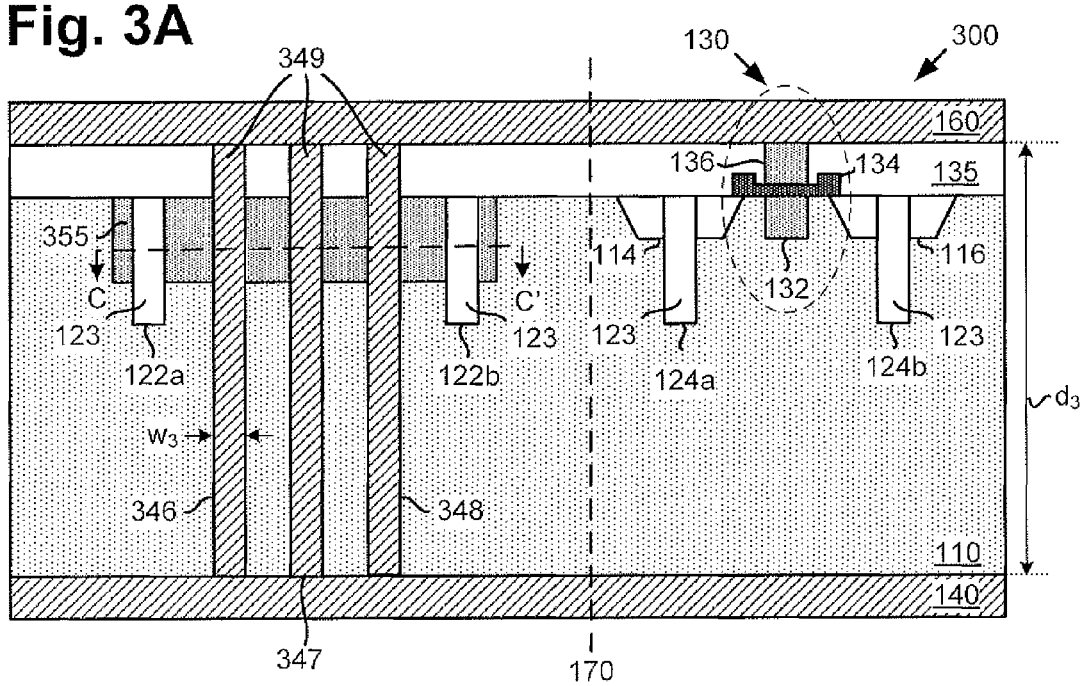
FIG. 3A illustrates an exemplary cross-sectional diagram of an array of isolated through silicon vias, according to one implementation of the present disclosure.

FIG. 3A illustrates an exemplary cross-sectional diagram of an array of isolated through silicon vias, in accordance with one implementation of the present disclosure. Cross-sectional view 300 of FIG. 3A may be substantially the same as cross-sectional view 100 of FIG. 1A, except for the following differences. Semiconductor substrate 110 may not include STI 112. In addition, an array of smaller TSVs, including TSVs 346, 347 and 348 (346-348), may be etched through PMD 135 and into semiconductor 110. TSVs 346-348 may be filled with metallic filler 349, which may be titanium, tungsten or any other suitable metallic filler. TSVs 346-348 may each have a width $w_3$ of approximately 2-3 μm and a depth $d_3$ of approximately 100 μm, extending to a bottom surface of semiconductor 110 after a subsequent backside polish. However, each TSV in the array may have a different width and depth from those disclosed above, in accordance with a particular application. TSVs 346-348 may each be connected to backside ground plate 140 on the backside of semiconductor substrate 110. In addition, TSVs 346-348 may contact metal 1 layer 160 on the top surface of PMD 135. Thus, emitter 136 of HBT 130 may be electrically connected to each of TSVs 346-348 by metal 1 layer 160. Finally, doped region 355 may be disposed in a region around TSVs 346-348 and DT loop 122, including DTs 122a and 122b. Doped region 355 may provide a relatively low resistance path between grounded TSVs 346-348 and DT loop 122 to ensure the doped silicon around the trench is effectively grounded, regardless of the resistivity of semiconductor substrate 110. DT loop 122 effectively isolates the array of TSVs, including TSVs 346-348, from a signal generated by a voltage potential at collector 132 of HBT 130, for example. For the purpose of FIG. 3A, elements not discussed but having matching numerals with corresponding elements of FIG. 1A may be as described regarding FIG. 1A above.

Figure 3B:
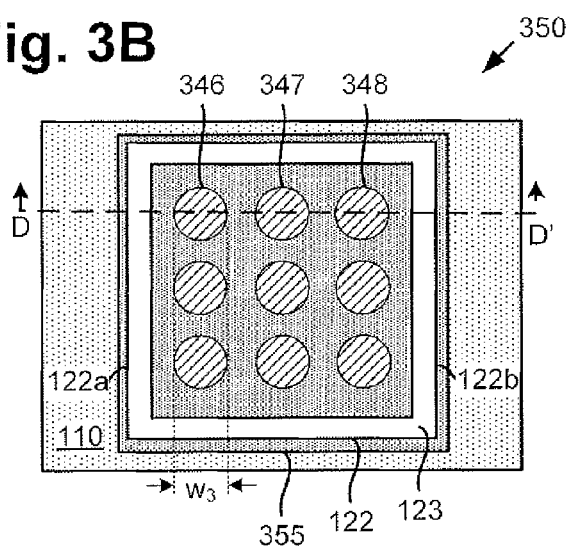
FIG. 3B illustrates an exemplary top view of an array of isolated through silicon vias, according to one implementation of the present disclosure.

To better understand the concepts shown in FIG. 3A, FIG. 3B illustrates an exemplary top view of an array of isolated through silicon vias, in accordance with one implementation of the present disclosure. For example, top view 350 may correspond to a view of FIG. 3A, left of line 170 and looking in the direction of the arrows at dotted line C-C'. Likewise, the portion of FIG. 3A to the left of line 170 may correspond to a view of FIG. 3B looking in the direction of the arrows at dotted line D-D'. Top view 350 may show an array of TSVs, including TSVs 346-348 for example, completely surrounded by DT loop 122, including DTs 122a and 122b. DT loop 122 may have a width $w_2$ of approximately 1.5 μm, a depth of approximately 15 μm and may be filled with dielectric filler 123. Each of the TSV in the TSV array may have a width $w_3$ of approximately 2-3 μm and a depth, not shown, of approximately 100 μm such that each of TSVs 346-348 may extend to the backside of semiconductor substrate 110 after backside grinding. In addition, each of the DTs shown in either of FIGS. 3A and 3B may have arrangements as shown in either of FIG. 1B or 1C. Furthermore, doped region 355 may be deposited in a similar location in FIG. 1A under the circumstances that either STI 112 is not present, or doping may be performed at an energy level high enough to deposit substantially all of the dopants immediately below STI 112.

A first method of fabrication will now be described with reference to FIG. 4 and FIGS. 5A-5E. FIG. 4 presents a flowchart of actions taken to implement a method of fabricating an insulated TSV, according to an implementation of the present disclosure. FIGS. 5A-5E illustrate progressive cross-sectional views of the fabrication of an insulated TSV, according to an implementation of the present disclosure.

Figure 5A:
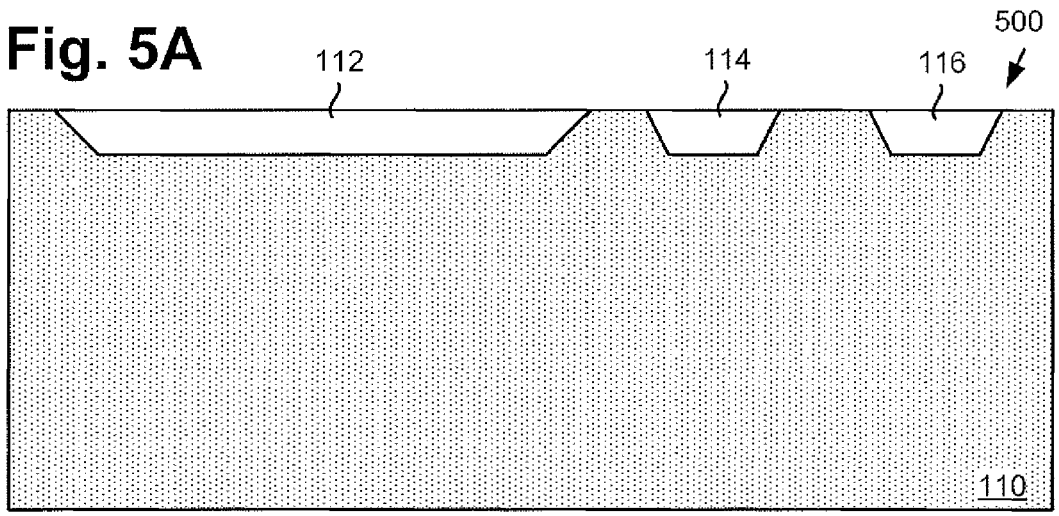
FIG. 5A illustrates a progressive cross-sectional view of the fabrication of an insulated TSV, according to an implementation of the present disclosure.
Figure 5B:
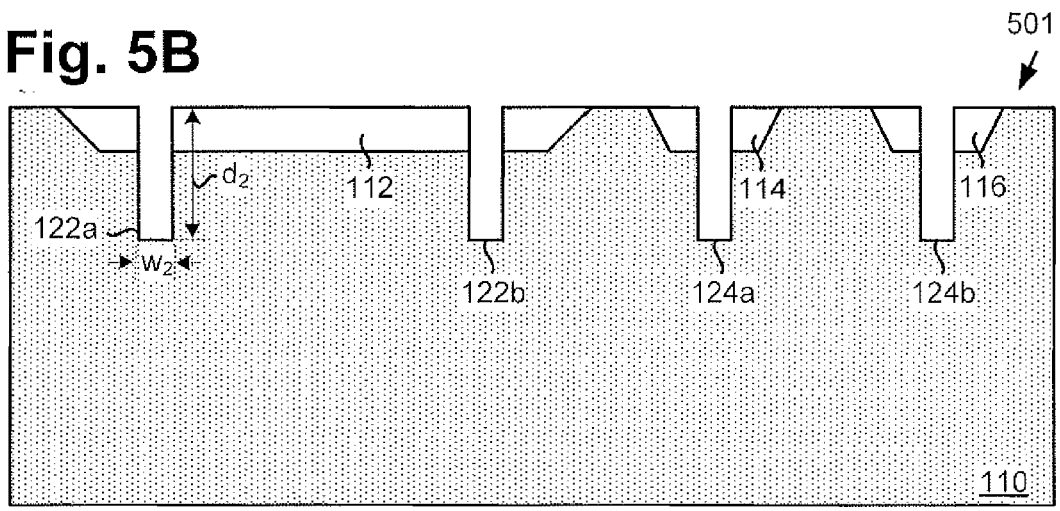
FIG. 5B illustrates a progressive cross-sectional view of the fabrication of an insulated TSV, according to an implementation of the present disclosure.
Figure 5C:
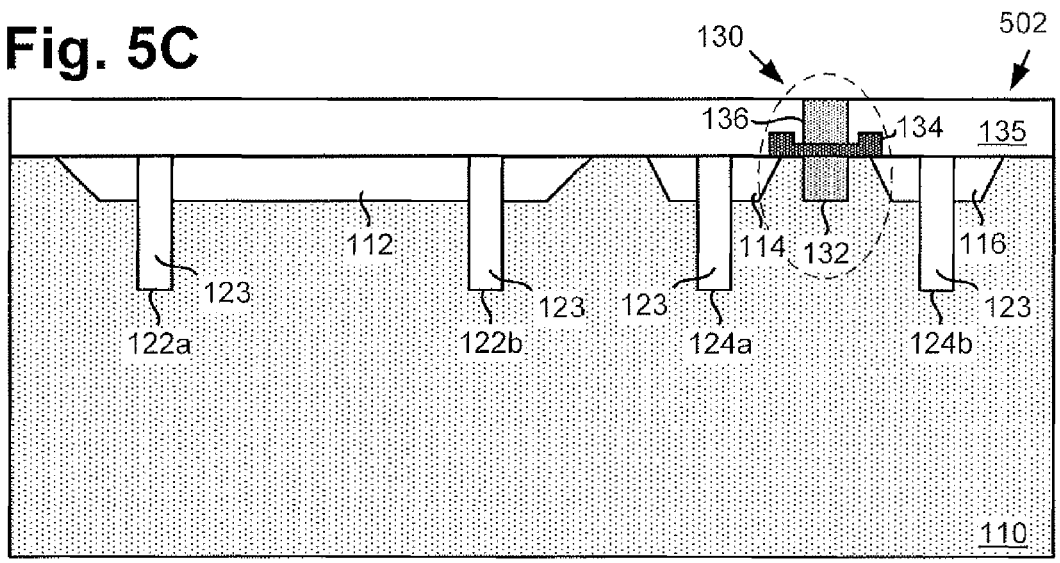
FIG. 5C illustrates a progressive cross-sectional view of the fabrication of an insulated TSV, according to an implementation of the present disclosure.

Cross-sectional view 500 of FIG. 5A shows semiconductor substrate 110 including several STIs, for example STI 112, 114 and 116, formed in a top surface of substrate 110. However, STIs 112, 114 and 116 may be optional, depending on the design requirements of a particular application. Such a substrate may be utilized as a starting point for fabrication of an insulated TSV for improving electrical signal isolation in RF technologies.

FIG. 4 shows action 410 of flowchart 400. Action 410 may include etching a deep trench isolation loop to a first depth into a substrate. Cross-sectional view 501 of FIG. 5B may present the result of action 410 applied to the structure of FIG. 5A. For example, DTs 122a and 122b may both be portions of a DT loop for isolating a subsequently formed TSV. Likewise, DT 124a and 124b may both be portions of another DT loop for isolating one or more active device within or on semiconductor substrate 110. Each DT loop may be etched into substrate 110 to a depth of 15 μm, for example. A width $w_2$ of each DT may be approximately 1.5 μm. Because each of DTs 122a, 122b, 124a and 124b are etched in the same process action, creating DT isolation for TSV 145 does not require an extra process step during fabrication.

Action 420 of flowchart 400 may include depositing a dielectric material into the DT loop. Cross-sectional view 502 of FIG. 5C may present the result of at least action 420 applied to the structure of FIG. 5B. For example, each of DTs 122a, 122b, 124a and 124b may be filled with dielectric filler 123. As shown in FIGS. 1B and 1C, each of the DTs may be either completely filled with dielectric filler 123, or lined with dielectric filler 123 and then filled with polysilicon. The structure shown in FIG. 5C may additionally require fabricating HBT 130, for example, including collector 132, base 134 and emitter 136. PMD 135 may then be deposited over both HBT 130 and each of the DTs.

Action 430 of flowchart 400 may include etching one or more TSVs to a second depth into the semiconductor substrate, the one or more TSVs being disposed within a perimeter of the deep trench isolation loop. Cross-sectional view 503 of FIG. 5D may present the result of action 430 applied to the structure of FIG. 5C. For example, TSV 145 may be etched into semiconductor substrate 110 to a depth $d_1$ of approximately 100 μm. TSV 145 may be located between DT 122a and 122b, both of which are a part of the same DT loop, as shown in FIG. 2A or 2B. Line 518 may correspond to the backside of semiconductor 110 after a subsequent fill of TSV 145 and a backside grind.

Action 440 of flowchart 400 may include filling the one or more TSVs with a metallic filler. Cross-sectional view 504 of FIG. 5E may present the result of action 440 applied to the structure of FIG. 5D. For example, TSV 145 may be filled with metallic filler 146, which may be titanium, tungsten or any other suitable metallic filler. After TSV 145 has been filled, a backside polish may be performed until metallic filler 146 of TSV 145 is exposed through the backside of semiconductor substrate 110. A backside ground plate 140 may be deposited on the backside of semiconductor substrate 110 and attached to TSV 145. In addition, metal 1 layer 160 may be deposited on PMD 135, providing a low resistance, low inductance electrical connection between emitter 136 of HBT 130 and ground plate 140 through TSV 145. Once fabricated to this point, the structure of FIG. 5E may be substantially the same as the structure of FIG. 1A.

Figure 6:
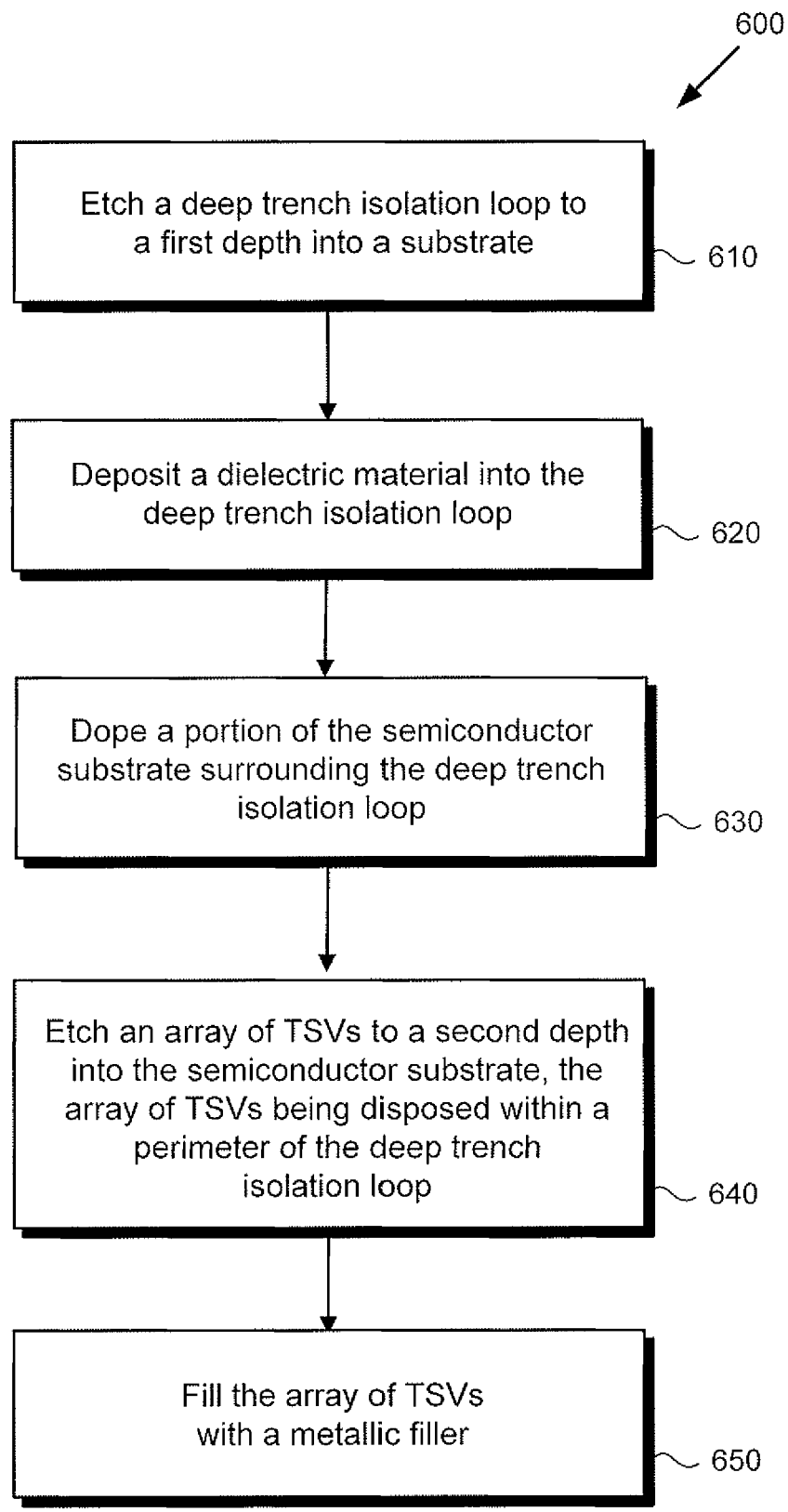
FIG. 6 presents a flowchart of actions taken to implement a method of fabricating an array of insulated TSVs, according to an implementation of the present disclosure.

A second method of fabrication will now be described with reference to FIG. 6 and FIGS. 7A-7F. FIG. 6 presents a flowchart of actions taken to implement a method of fabricating an array of insulated TSVs, according to an implementation of the present disclosure. FIGS. 7A-7F illustrate progressive cross-sectional views of the fabrication of an array of insulated TSVs, according to an implementation of the present disclosure.

Figure 7A:
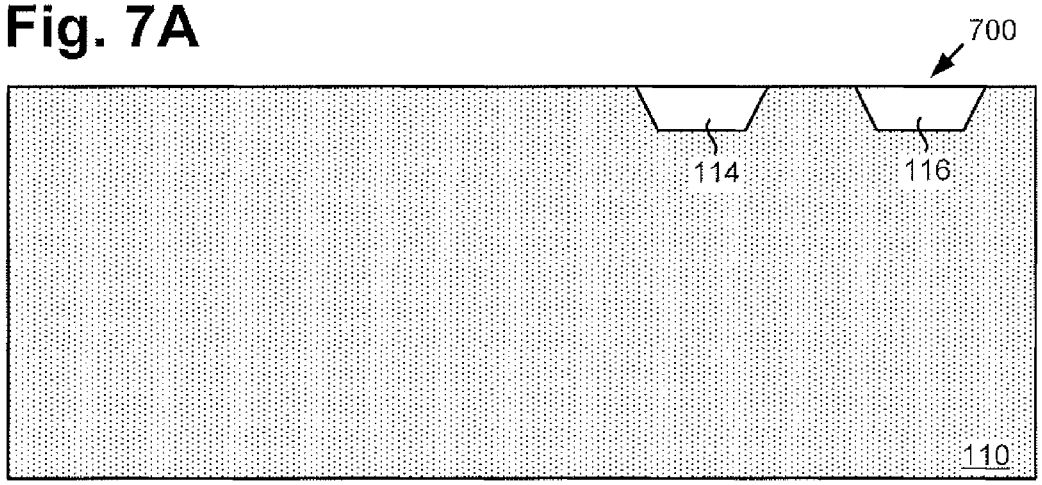
FIG. 7A illustrates a progressive cross-sectional view of the fabrication of an array of insulated TSVs, according to an implementation of the present disclosure.
Figure 7B:
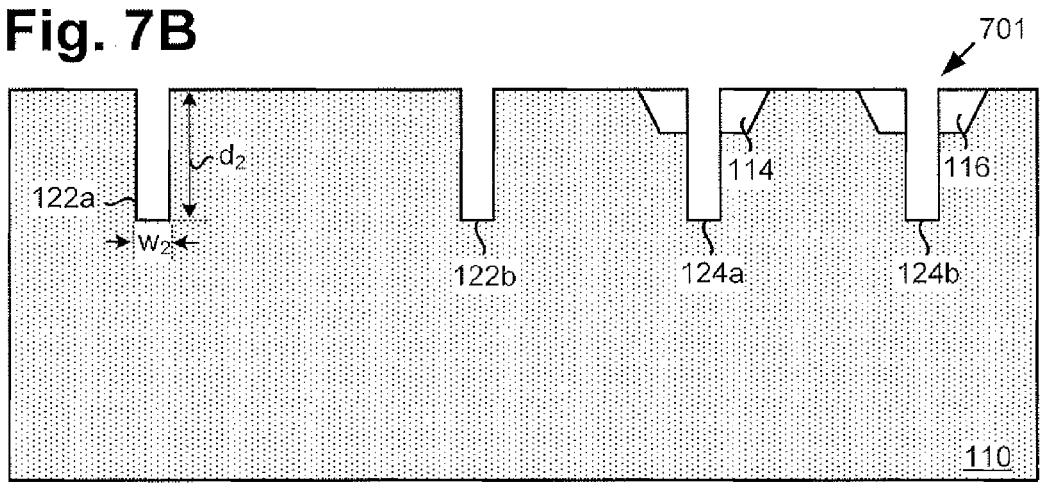
FIG. 7B illustrates a progressive cross-sectional view of the fabrication of an array of insulated TSVs, according to an implementation of the present disclosure.
Figure 7C:
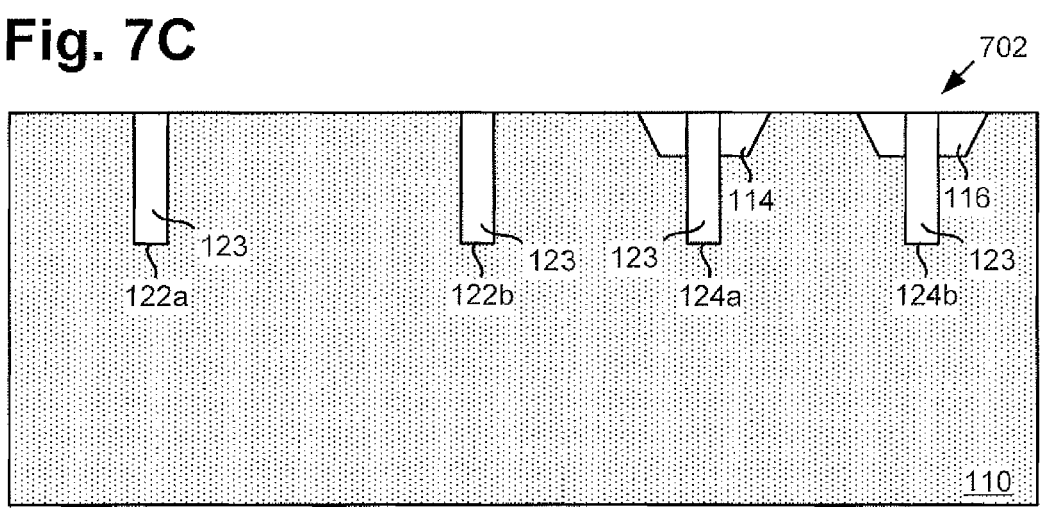
FIG. 7C illustrates a progressive cross-sectional view of the fabrication of an array of insulated TSVs, according to an implementation of the present disclosure.

For example, cross-sectional view 700 of FIG. 7A shows a structure substantially the same as the structure of FIG. 5A, except that the structure of FIG. 7A may omit STI 112. Moreover, STIs 114 and 116 may be optional, depending on the design requirements of a particular application. Such a substrate may be utilized as a starting point for fabrication of an array of insulated TSVs for improving electrical signal isolation in RF technologies.

FIG. 6 shows action 610 of flowchart 600. Action 610 may include etching a DT loop to a first depth into a substrate. Cross-sectional view 701 of FIG. 7B may present the result of action 610 applied to the structure of FIG. 7A. For example, DT 122a and 122b may both be portions of a DT loop for isolating a subsequently fabricated array of TSVs. Likewise, DT 124a and 124b may both be portions of another DT loop for isolating one or more active device within or on semiconductor substrate 110. Each DT loop may be etched into substrate 110 to a depth $d_2$ of 15 µm, for example. A width $w_2$ of each DT may be approximately 1.5 µm.

Action 620 of flowchart 600 may include depositing dielectric material into the deep trench isolation loop. Cross-sectional view 702 of FIG. 7C may present the result of at least action 620 applied to the structure of FIG. 7B. For example, each of DTs 122a, 122b, 124a and 124b may be filled with dielectric filler 123. As previously stated regarding FIGS. 1B and 1C, each of the DTs may be either completely filled with dielectric filler 123, or lined with dielectric filler 123 and then filled with poly-silicon.

Action 630 of flowchart 600 may include doping a portion of the semiconductor substrate surrounding the deep trench isolation loop. Cross-sectional view 703 of FIG. 7D may present the result of action 630 applied to the structure of FIG. 7C. For example, doped region 355 may be formed by subjecting a portion of semiconductor substrate 110 surrounding DTs 122a and 122b to ion implantation, for example. However, any suitable method of providing a region of lower resistivity may be utilized. Doped region 355 may be located in portions immediately adjacent the top portion of each of DTs 122a and 122b. Alternatively, doped region 355 may additionally be located in the top portion of semiconductor substrate 110 located within the DT loop including DTs 122a and 122b. In yet another alternative, doped region 355 may be a part of a P-well, which may form a body region of one or more MOS devices within semiconductor substrate 110. Doped region 355 may provide a low resistance ground path between the DT loop including DTs 122a and 122b and a subsequently fabricated array of isolated TSVs within the DT loop.

Figure 7D:
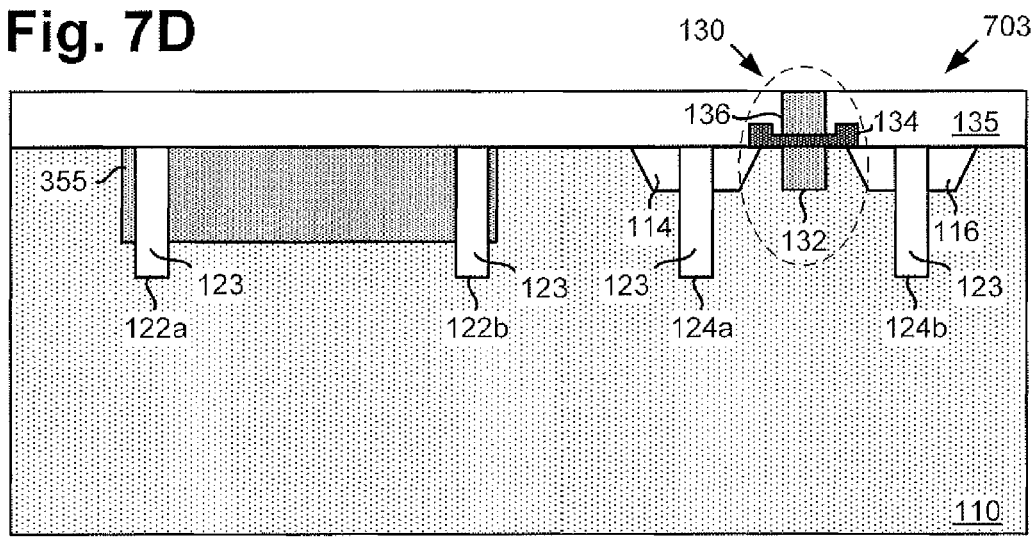
FIG. 7D illustrates a progressive cross-sectional view of the fabrication of an array of insulated TSVs, according to an implementation of the present disclosure.
Figure 7E:
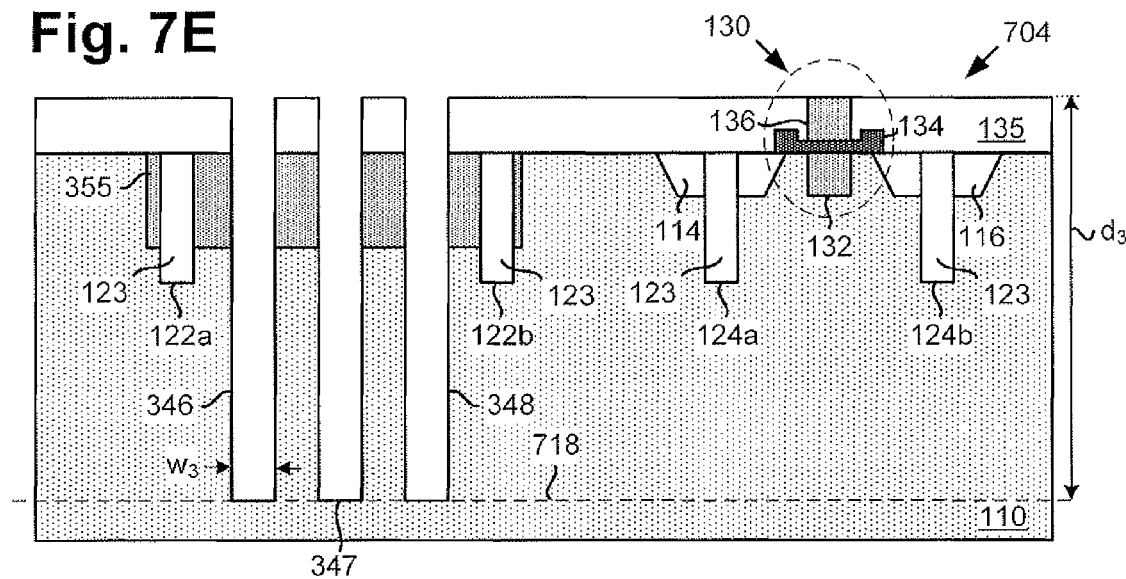
FIG. 7E illustrates a progressive cross-sectional view of the fabrication of an array of insulated TSVs, according to an implementation of the present disclosure.
Figure 7F:
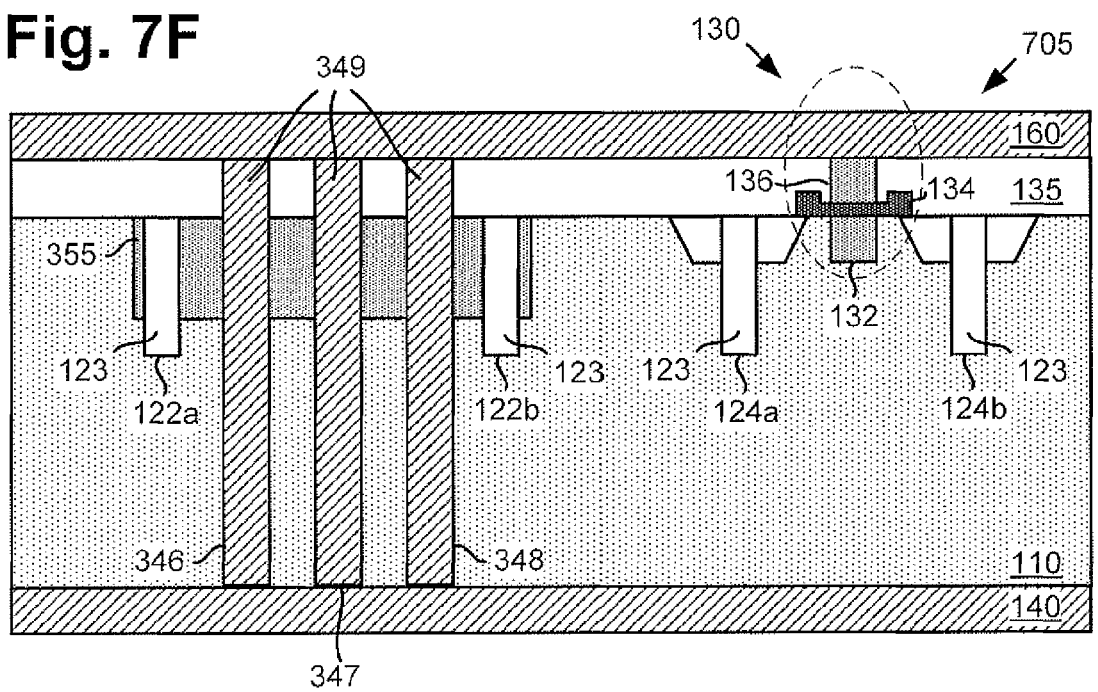
FIG. 7F illustrates a progressive cross-sectional view of the fabrication of an array of insulated TSVs, according to an implementation of the present disclosure.

Cross-sectional view 703 of FIG. 7D may additionally show fabricated HBT 130 including collector 132, base 134 and emitter 136 disposed in or on semiconductor substrate 110, for example. In addition, PMD 135 may be deposited over HBT 130 and each of the DTs.

Action 640 of flowchart 600 may include etching an array of TSVs to a second depth into the semiconductor substrate, the array of TSVs being disposed within a perimeter of the deep trench isolation loop. Cross-sectional view 704 of FIG. 7E may show the result of action 640 applied to the structure of FIG. 7D. For example, an array including TSVs 346, 347 and 348 may be etched into semiconductor substrate 110 to a depth $d_3$ of approximately 100 µm and having a width $w_3$ of approximately 2-3 µm, for example. TSVs 346-348 may be located within the DT loop including DT 122a and 122b. Line 718 may correspond to the backside of semiconductor 110 after a subsequent fill of TSVs 346-348 and a backside grind.

Action 650 of flowchart 600 may include filling the array of TSVs with a metallic filler. Cross-sectional view 705 of FIG. 7F may present the result of action 650 applied to the structure of FIG. 7E. For example, TSVs 346-348 may be filled with metallic filler 349, which may be titanium, tungsten or any other suitable metallic filler. After TSVs 346-348 have been filled, a backside polish may be performed until metallic filler 349 of TSVs 346-348 are exposed through the backside of semiconductor substrate 110. A backside ground plate 140 may be deposited on the backside of semiconductor substrate 110 and attached to each of TSVs 346-348. In addition, metal 1 layer 160 may be deposited on PMD 135, providing a low resistance, low inductance electrical connection between emitter 136 of HBT 130 and ground plate 140 through each of TSVs 346-348. At this point in fabrication, the structure of FIG. 7F may be substantially the same as the structure of FIG. 3A.

Accordingly, the present application provides an isolated TSV, or an array of isolated TSVs, having reduced current leakage from active devices and an increase in isolation without the addition of costly lithography steps or long diffusion thermal cycles during fabrication.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A method for providing electrical isolation in a semiconductor substrate, said method comprising:
    etching a deep trench isolation loop and another deep trench isolation loop concurrently to a first depth into said semiconductor substrate, said deep trench isolation loop extending through a shallow trench insulation region and terminating in said semiconductor substrate below a bottom surface of said shallow trench insulation, a width of said deep trench isolation loop being substantially equal to a width of said another deep trench isolation loop;
    forming a semiconductor device within a perimeter of said another deep trench isolation loop;
    depositing a dielectric material into said deep trench isolation loop;
    etching one or more through silicon vias (TSVs) to a second depth into said semiconductor substrate, said one or more TSVs being disposed within a perimeter of said deep trench isolation loop.

2. The method of claim 1, further comprising doping a portion of said semiconductor substrate surrounding said deep trench isolation loop.

3. The method of claim 1, further comprising filling said one or more TSVs with a metallic filler.

4. The method of claim 3, wherein said metallic filler is selected from the group consisting of titanium and tungsten.

5. The method of claim 3, wherein said metallic filler is in direct electrical contact with said semiconductor substrate.

6. The method of claim 1, wherein said one or more TSVs are part of an array of TSVs.

7. The method of claim 1, wherein said dielectric material completely fills said deep trench isolation loop.

8. The method of claim 1, wherein said dielectric material lines said deep trench isolation loop, providing an unfilled portion of said deep trench isolation loop.

9. The method of claim 8, further comprising depositing a filler material over said dielectric material to fill said unfilled portion of said deep trench isolation loop.

10. The method of claim 9, wherein said filler material comprises polysilicon.

11. A structure for providing electrical isolation in a semiconductor substrate, said structure comprising:
- a deep trench isolation loop having a first depth disposed in said semiconductor substrate, said deep trench isolation loop extending through a shallow trench insulation region and terminating in said semiconductor substrate below a bottom surface of said shallow trench insulation;
- a semiconductor device within a perimeter of another deep trench isolation loop having said first depth disposed in said semiconductor substrate, a width of said deep trench isolation loop being substantially equal to a width of said another deep trench isolation loop;
- a dielectric material disposed in said deep trench isolation loop;
- one or more through silicon vias (TSVs), having a second depth, disposed in said semiconductor substrate and within a perimeter of said deep trench isolation loop.

12. The structure of claim 11, further comprising a doped portion of said semiconductor substrate surrounding said deep trench isolation loop.

13. The structure of claim 11, further comprising a metallic filler within said one or more TSVs.

14. The structure of claim 13, wherein said metallic filler is selected from the group consisting of titanium and tungsten.

15. The structure of claim 13, wherein said metallic filler is in direct electrical contact with said semiconductor substrate.

16. The structure of claim 11, wherein said one or more TSVs are part of an array of TSVs.

17. The structure of claim 11, wherein said dielectric material completely fills said deep trench isolation loop.

18. The structure of claim 11, wherein said dielectric material lines said deep trench isolation loop, providing an unfilled portion of said deep trench isolation loop.

19. The structure of claim 18, further comprising a filler material disposed over said dielectric material and filling said unfilled portion of said deep trench isolation loop.

20. The structure of claim 19, wherein said filler material comprises polysilicon.

* * * * *